United States Patent
Lee

[11] Patent Number: 6,156,122
[45] Date of Patent: Dec. 5, 2000

[54] DEPOSITOR FOR DEPOSITING A DIELECTRIC LAYER WITH FEWER METALLIC IMPURITIES AND A METHOD FOR REDUCING THE CONTENT OF THE METALLIC IMPURITIES IN THE DIELECTRIC LAYER BY USING THIS DEPOSITOR

[75] Inventor: Ching-Lun Lee, Taipei, Taiwan

[73] Assignee: Winbond Electronics Corp., Hsinchu, Taiwan

[21] Appl. No.: 09/393,105

[22] Filed: Sep. 9, 1999

[30]   Foreign Application Priority Data

Jun. 30, 1999 [TW] Taiwan ................................. 88111069

[51] Int. Cl.[7] .................................................. C23C 16/00
[52] U.S. Cl. ............................................ 118/715; 438/541
[58] Field of Search ............................. 118/715; 438/541

[56]   References Cited

U.S. PATENT DOCUMENTS

| | | | |
|---|---|---|---|
| 5,014,646 | 5/1991 | Ito et al. | 118/725 |
| 5,123,376 | 6/1992 | Kaneko et al. | 118/718 |
| 5,928,428 | 7/1999 | Horie | 118/724 |
| 5,935,334 | 8/1999 | Fong et al. | 118/723 ME |
| 5,976,471 | 11/1999 | Simandl et al. | 422/122 |
| 5,994,209 | 11/1999 | Yieh et al. | 438/541 |

*Primary Examiner*—Gregory Mills
*Assistant Examiner*—Sylvia R. MacArthur
*Attorney, Agent, or Firm*—Ladas & Parry

[57]   ABSTRACT

The present invention is characterized by setting a filter in the $O_3$-pipe of the depositor used to depositing a dielectric layer, wherein the filter is used to adsorb the metallic impurities in the $O_3/O_2$ pipe. Therefore, the content of metallic impurities in the deposited dielectric layer can be efficiently reduced.

10 Claims, 1 Drawing Sheet

DEPOSITOR FOR DEPOSITING A DIELECTRIC LAYER WITH FEWER METALLIC IMPURITIES AND A METHOD FOR REDUCING THE CONTENT OF THE METALLIC IMPURITIES IN THE DIELECTRIC LAYER BY USING THIS DEPOSITOR

FIELD OF THE INVENTION

The invention relates to a depositor for depositing a dielectric layer with fewer metallic impurities, and a method for reducing the content of the metallic impurities in the dielectric layer by means of the above depositor.

BACKGROUND OF THE INVENTION

In BPSG or PSG processes, metallic impurities are a serious problem. In the 64M DRAM process, BPSG and PSG are used as a pre-metal dielectric layer (PMD) overlaying the gate, therefore the content of the metallic layer therein is important. For example, if the content of the metallic impurities in the PMD consisting of BPSG is more than $1 \times 10^{15} \sim 2 \times 10^{16}$ atoms/cm$^3$, the PMD overlaying the gate will make leakage current and reduce the functionality of the products.

SUMMARY OF THE INVENTION

Therefore, the feature of the present inventions is to provide a novel depositor to efficiently reduce the content of the metallic impurities in the PMD.

The present invention is characterized by setting a filter with metal adsorbent thereon in the $O_3$ pipe to adsorb the metallic impurities in the $O_3/O_2$ generated by the $O_3$-generator, resulting in fewer metallic impurities present in the depositing gas reactor. Therefore, the content of the metallic impurities of the dielectric layer deposited by this modified depositor with an $O_3$-filter will be efficiently reduced.

DETAILED DESCRIPTION OF THE INVENTION

Figure 1:
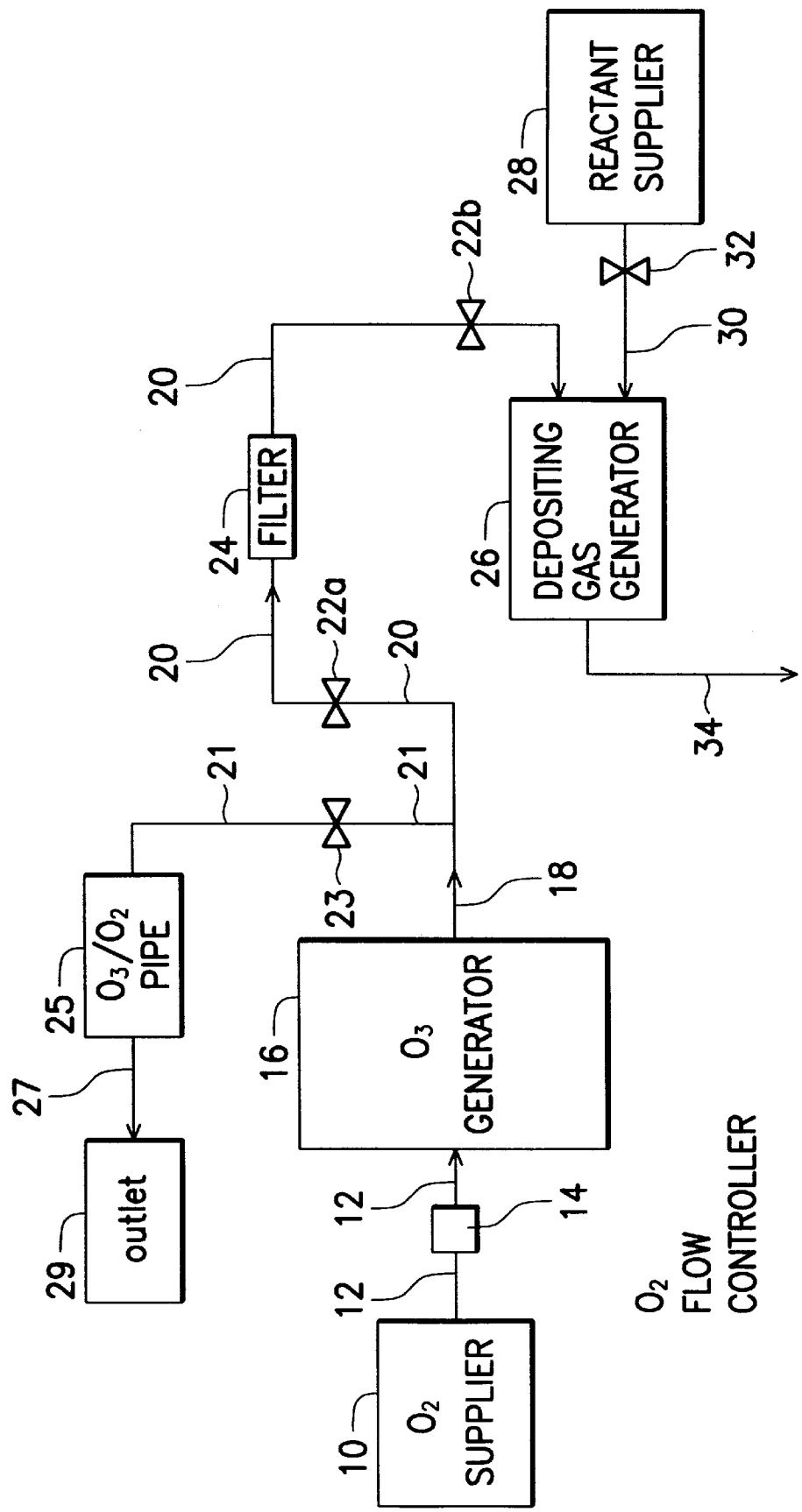
FIG. 1 illustrates the modified APT-system depositor according to the present invention.

One feature of the invention is that a depositor for depositing a dielectric layer with fewer metallic impurities is disclosed. This depositor comprises an $O_3$-generator, a depositing gas reactor, an $O_3/O_2$ pipe, and an $O_3$ filter set in the $O_3/O_2$ pipe to filter the metallic impurities from the $O_3$-generator and subsequently reduce the content of the metallic impurities in the depositing gas. Therefore, the metallic impurities in the dielectric layer deposited by the depositor can be reduced. The dielectric layer is selected from one of the group consisting of USG, BPSG, PSG and BSG. The depositor is an Atmospheric Pressure Deposition Technology APT-system. Moreover, the filter consists of a gas filter, such as a filter consists of carbon fibers upon which metal particles can be adsorbed.

Another feature of the present invention is that a method for reducing the metallic impurities in depositing dielectric layer is disclosed. First, a depositor comprising of an $O_3$-generator, a depositing gas reactor, and an $O_3/O_2$ pipe is provided. Then an $O_3$-filter is set in the $O_3/O_2$ pipe to filter the metallic impurities in $O_3/O_2$ generated by the $O_3$-generator. As described above, the dielectric layer is selected from one of the group consisting of USG, BPSG, PSG and BSG. The depositor is an APT-system. Moreover, the filter consists of a gas filter, such as a filter consists of carbon fibers upon which metal particles can be adsorbed.

EMBODIMENT OF THE INVENTION

Referring to FIG. 1, the modified Cannon-APT system according to the present invention is illustrated. However, this is not intended to limit the present invention; any conventional depositor for depositing a dielectric layer can also be applied.

This system comprises of an $O_2$-supplier 10, an $O_3$-generator 16, a depositing gas generator 26 and a reactant supplier 28, wherein the $O_2$-supplier 10 is used to supply $O_3$-generate 16 with $O_2$ through the $O_2$ pipe 12 to generator desired $O_3$. Moreover, the $O_2$ flux can be adjusted by means of an $O_2$ flux controller (AFC) 14 set in the $O_2$ pipe 12.

The $O_3/O_2$ generated by the $O_3$-generator 16 is introduced into the depositing gas generator 26 by the $O_3/O_2$ pipe 20 connected to outlet 18. Moreover, the $O_3/O_2$ pipe 20 is connected to a pressure-controlling pipe 21 to adjust the pressure of the $O_3/O_2$ in the pipe 20. When the pressure of pipe 20 is too high, the on/off valve 23 in pipe 21 opens to introduce excess $O_3$ into the $O_3$ output device and transfer the excess $O_3$ to outlet 29 through pipe 27.

It is a characteristic of the present invention that an extra $O_3$-filter is set in the $O_3/O_2$ pipe of this system to remove the metal particles of the $O_3/O_2$ generated by the $O_3$-generator 16 of this system. In this embodiment, a gas filter 24, such as a filter consisting of carbon fiber, is set in the $O_3/O_2$ pipe 25 to adsorb the metallic impurities by means of the metal-adsorbent thereon. Then, $O_3/O_2$ containing trace metallic impurities is obtained and introduced into the depositing gas generator 26 through pipe 20. Moreover, in order to control the $O_3/O_2$ flux in pipe 20, controlling valves 22a and 22b are independently set in the pipe 24 between outlet 18 and filter 24 and the pipe 20 between filter 24 and depositing gas generator 26.

In addition, the reactant for depositing a dielectric layer, such as TEOS for TEOS glass film, is supplied by reactant supplier 28. The reactant is introduced into the depositing gas generator 26 through pipe 30. Similarly, a controlling valve 32 is set in pipe 30 to adjust the reactant flux. When the $O_3/O_2$ has mixed well with the reactant in the depositing gas generator 26, the depositing gas is sprayed out through pipe 34 to deposit a desired dielectric layer.

In order to compare the content of metallic impurities in BPSG layers deposited by the Cannon-APT system with or without setting an $O_3$-filter in the $O_3/O_2$ pipe to adsorb the metallic impurities, the BPSG layers formed by the system of the prior art and by the system of the present invention were analyzed by AAS. The results are recorded in table 1.

TABLE 1

| | Metallic impurities (atoms/cm$^3$) | | | | | |
|---|---|---|---|---|---|---|
| Sample | Na | Cr | Fe | Ni | Al | Cu |
| APT | 7.1E15 | 2.2E14 | 2.6E14 | 2.7E15 | 1.4E15 | 1.5E14 |
| WPT + filter | 2.9E15 | ND | ND | ND | 4.6E14 | 1.0E14 |

ND: no detection

As shown in table 1, the metallic impurities of the BPSG sample deposited by the modified APT-system with an $O_3$-filter were less than the BPSG sample deposited by the ATP system without an $O_3$-filter. The result indicates that the metallic impurities in $O_3/O_2$ can be efficiently adsorbed by the $O_3$-filter set in the $O_3/O_2$ pipe. A dielectric layer with only trace metallic impurities can be obtained by the APT-system with an $O_3$-filter as described above, therefore the leakage current of this dielectric can be reduced.

From the above description, one skilled in this art can easily ascertain the essential characteristics of the present invention, and, without departing from the spirit and scope thereof, can make various changes and modifications of the invention to adapt it to various usage and conditions. Thus, other embodiments also fall within the scope of the following claims.

What is claim is:

1. A depositor for depositing a dielectric layer with a filtered deposition gas, comprising an $O_3$-generator, a depositing gas generator, an $O_3/O_2$ pipe, and a filter set in the $O_3/O_2$ pipe to filter the metallic impurities in the $O_3/O_2$ generated by the $O_3$-generator, wherein the filter reduces the content of the metallic impurities in the deposition gas and thereby decreases the metallic impurities in the dielectric layer deposited by the depositor.

2. The depositor as claimed in claim 1, wherein the dielectric layer is selected from one of the group consisting of USG, BPSG, PSG and BSG.

3. The depositor as claimed in claim 1, wherein the depositor works at atmospheric pressure.

4. The depositor as claimed in claim 1, wherein the filter consists of a gas filter on which metal particles can be adsorbed.

5. The depositor as claimed in claim 4, wherein the filter consists of carbon fibers.

6. A method for reducing the metallic impurities in depositing a dielectric layer, the steps comprising:

providing a depositor comprising an $O_3$-generator, a depositing gas reactor, and an $O_3/O_2$ pipe; and setting a filter in the $O_3/O_2$ pipe to filter the metallic impurities in the $O_3/O_2$ generated by the $O_3$-generator.

7. The method as claimed in claim 6, wherein the dielectric layer is selected from one of the group consisting of USG, BPSG, PSG and BSG.

8. The method as claimed in claim 6, wherein the depositor works at atmospheric pressure.

9. The method as claimed in claim 6, wherein the filter consists of a gas filter on which metal particles can be adsorbed.

10. The method as claimed in claim 9, wherein the filter consists of carbon fibers.

* * * * *